United States Patent [19]
Hoyt et al.

[11] 3,995,175
[45] Nov. 30, 1976

[54] HIGH IMPEDANCE VOLTAGE PROBE

[75] Inventors: Edward Stanley Hoyt, South Burlington; Joseph Zauchner, South Hero, both of Vt.

[73] Assignee: International Business Machines Corporation, Armonk, N.Y.

[22] Filed: June 30, 1975

[21] Appl. No.: 591,370

[52] U.S. Cl. .............................. 307/251; 307/279; 324/123 R
[51] Int. Cl.² .................. H03K 17/60; G01R 1/30
[58] Field of Search .......... 307/231, 251, 279, 304; 324/72, 5, 109, 123

[56] References Cited
UNITED STATES PATENTS

| | | | |
|---|---|---|---|
| 3,532,981 | 10/1970 | Bozoian | 324/123 R |
| 3,667,036 | 5/1972 | Seachman | 324/123 |
| 3,733,597 | 5/1973 | Healey et al. | 307/251 |
| 3,828,256 | 8/1974 | Lia | 324/72.5 |

OTHER PUBLICATIONS

Tech Note, An Electrometer Amplifier for Electrophysiology with Low Input Capacitance, by Holmer, Med. & Biol. Eng. vol. 5, No,. 5, pp. 509-511.

Primary Examiner—Michael J. Lynch
Assistant Examiner—B. P. Davis
Attorney, Agent, or Firm—Edward S. Gershuny

[57] ABSTRACT

A high impedance voltage probe with excellent high frequency response and extremely light loading of the circuit under test. The probe uses an IGFET input device having its source connected to a constant current source and to an amplifying device, and its drain connected to a variable voltage source. The output of the amplifying device is connected to a constant current source, to a non-linear voltage translating device and to an output terminal. The voltage translating device is also connected to the variable current source.

4 Claims, 2 Drawing Figures

HIGH IMPEDANCE VOLTAGE PROBE

DETAILED DESCRIPTION

1. Background of The Invention

This invention relates generally to high impedance voltage probes. More particularly, the invention is concerned with a high impedance probe that has low capacitive and DC current loading, good high frequency response, and is particularly suitable for internal probing of integrated IGFET circuits.

Although a great variety of high impedance probes are known in the prior art, they generally are not suitable for measuring high frequency AC voltages.

It is an object of the present invention to provide an improved high impedance voltage probe.

It is a more particular object to provide such a probe which is responsive to AC voltages in the nanosecond range.

Yet another object is to provide such a probe which has very low capacitive and DC current loading on the circuit to be measured.

2. Brief Description of The Invention

The above and other objects are accomplished in accordance with one aspect of this invention by providing a voltage probe which utilizes an FET input device which has its source connected to a constant current source and to an amplifying device, and its drain connected to a variable voltage source. The output of the amplifying device is connected to a constant current source, to a non-linear voltage translating device, and to an output terminal of the probe.

The most significant advantages of this invention, as compared with prior art high impedance probes, are its very low capacitive and DC current loading and its excellent high frequency response. The invention is suitable for testing integrated circuits on a chip, particularly IGFET dynamic memory circuitry.

The foregoing and other objects, features and advantages of the invention will be apparent from the following description of a preferred embodiment thereof as illustrated in the accompanying drawings.

DETAILED DESCRIPTION

Figure 1:
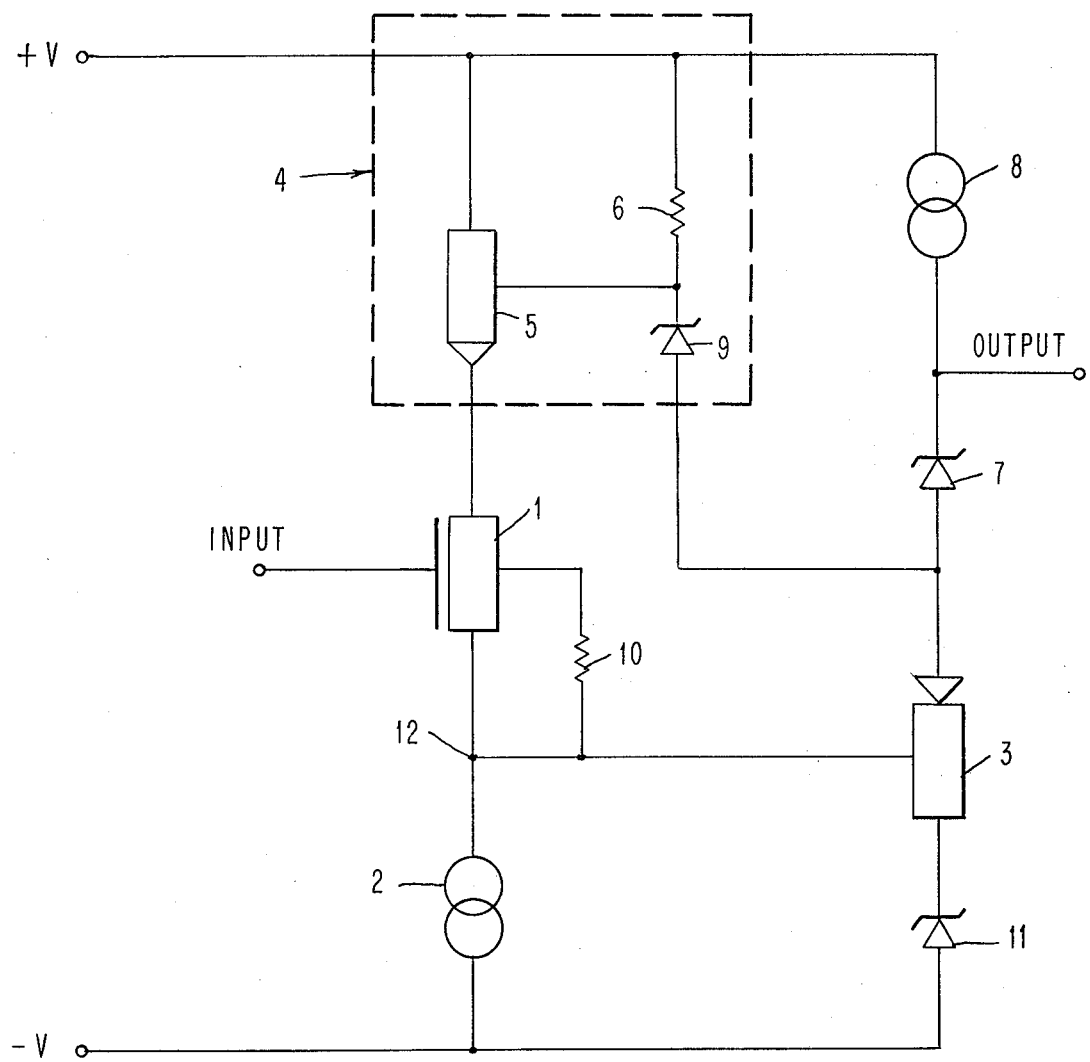
FIG. 1 is a generalized circuit drawing of the probe.

As shown in FIG. 1, the probe utilizes an isolated gate field effect transistor (IGFET) 1 as its input device. The input line is connected to the gate of the FET. The source of the input FET is connected to a constant current source 2 and to an amplifying device, transistor 3. The drain of IGFET 1 is connected to a variable and controlled voltage source (enclosed within broken line 4) which comprises a transistor 5 and a resistor 6 connected to a voltage + V, and a Zener diode 9. The output of the amplifying device 3 is connected, through Zener diode 7 (a voltage translating device), to a second constant current source 8, and to the output of the probe. It is also connected to translating device (Zener diode) 9 which is part of the variable voltage source 4.

In the preferred embodiment of this invention, the sensing device is an n-channel IGFET without protective diode and is operated in a normally off mode; that is, the device is conducting when the gate is more positive than the source. Drain voltage is more positive than the gate so the device is in the saturation region.

The substrate of IGFET 1 is connected to the source to enhance stability. If a low threshold device is used, a diode (14, FIG. 2) may be used in this connection; if a high threshold device is used, a resistor (10, FIG. 1) may be used. The sensing device is thus operated at an optimum current/power relationship. Frequency response is primarily a function of the magnitude of current of the IGFET and the bipolar circuit. Since power in the sensing device is constant, no temperature compensation is required.

Diode 11 serves to keep amplifying transistor 3 from breaking down at high voltage and to limit power dissipation in transistor 3.

When the probe is being used, the voltage across the IGFET 1 (from its input to node 12 and to the drain) will be constant for all input voltages. The current through the IGFET is also constant for all input voltages. This reduces the effective input capacitance to a minimum. It also holds the leakage current constant and independent of input voltage. The voltage shift of the sensing device is compensated in the following bipolar stage. The stage is an emitter follower with a constant current source.

Figure 2:
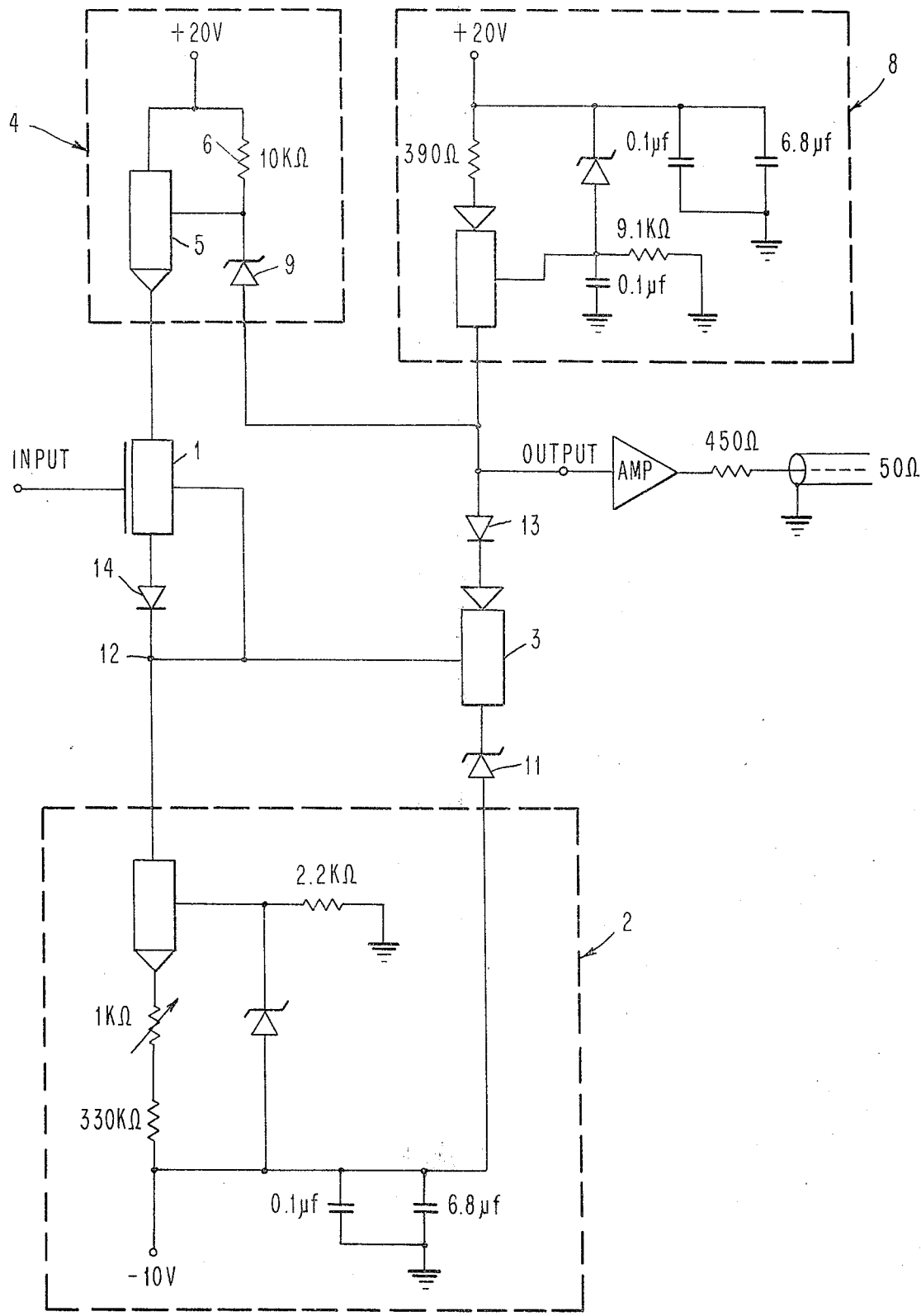
FIG. 2 is a circuit drawing of the probe showing additional details of the current sources and providing exemplary values for the various passive devices used in the probe.

FIG. 2 also is a circuit diagram of the voltage probe. It shows preferred implementations of the voltage source 4 and the current sources 2 and 8 (each enclosed within a broken line in FIG. 2) and shows preferred values for the resistors and capacitors used in these circuits. In this implementation, diode 13 serves as the voltage translating device to which the output of amplifying transistor 3 is connected.

A device built as shown in FIG. 2 will respond in a substantially linear manner to input voltages ranging from 0 to +15 volts, the output voltage being the same as the input voltage. Its response will be better than 0.5 volts per nanosecond. The capacitive loading of this device is less than 1 picofarad and DC current drawn is considerably less than 1 picoampere.

While the invention has been shown and described with respect to a preferred embodiment thereof, those skilled in the art will recognize that various changes in form and details may be made therein without departing from the spirit and scope of the invention.

What is claimed is:

1. A voltage sensing circuit comprising:
   an IGFET input device;
   an amplifying device, having its input connected to the source of said input device;
   a first constant current source connected to the source of said input device;
   a variable voltage source connected to the drain of said input device;
   a second constant current source; and
   a voltage translating device having a first terminal connected to said second constant current source and a second terminal connected to the output of said amplifying device;
   said first terminal also being connected to the output of the voltage sensing circuit;
   said second terminal also being connected to said variable voltage source.

2. The voltage sensing circuit of claim 1 further comprising:
   bias means connected between the substrate and the source of said input device for establishing the threshold voltage of said input device.

3. The voltage sensing circuit of claim 2 wherein said bias means comprises a diode for generating a negative substrate bias with respect to the source of said input device.

4. The voltage sensing circuit of claim 2 further comprising:
a diode connected to said amplifying device so as to limit power dissipation therein.

* * * * *